(12) United States Patent
Schneider

(10) Patent No.: US 7,583,208 B1
(45) Date of Patent: Sep. 1, 2009

(54) COMPACT ENCODING OF NON-REPEATING SEQUENCES

(75) Inventor: James P. Schneider, Raleigh, NC (US)

(73) Assignee: Red Hat, Inc., Raleigh, NC (US)

( * ) Notice: Subject to any disclaimer, the term of this patent is extended or adjusted under 35 U.S.C. 154(b) by 0 days.

(21) Appl. No.: 12/118,541

(22) Filed: May 9, 2008

(51) Int. Cl.
*H03M 5/00* (2006.01)

(52) U.S. Cl. ......................................... 341/55; 341/50
(58) Field of Classification Search ............... 341/50–70
See application file for complete search history.

(56) References Cited

U.S. PATENT DOCUMENTS

| | | | | |
|---|---|---|---|---|
| 5,796,356 A | * | 8/1998 | Okada et al. | 341/51 |
| 6,744,388 B1 | * | 6/2004 | Khu | 341/51 |
| 6,816,101 B2 | * | 11/2004 | Hietala et al. | 341/155 |
| 7,071,848 B1 | * | 7/2006 | Khu | 341/51 |

* cited by examiner

*Primary Examiner*—Lam T Mai
(74) *Attorney, Agent, or Firm*—Blakely, Sokoloff, Taylor & Zafman, LLP

(57) ABSTRACT

Techniques for encoding and decoding non-repeating data objects are described herein. According to one embodiment, an input stream having non-repeating literals is received to be encoded into an output stream having a preamble and a payload, where each of the non-repeating literal is encoded via a unique data value, a lowest value among data values representing the literals to be encoded and a literal count representing a number of literals to be encoded are identified. A bit count representing a number of bits required to encode each of the literals is determined. The lowest value, the literal count, and the bit count are emitted into a preamble of an output stream. For each literal of the input stream, a code value representing a predetermined relationship between the data value associated with each literal and the identified lowest value is emitted to the payload of the output stream.

28 Claims, 15 Drawing Sheets

| Literal | a | b | r | c | d |
|---|---|---|---|---|---|
| ASCII Code | 0x61 | 0x62 | 0x72 | 0x63 | 0x64 |

FIG. 2A

| Min. Value | Diff. b/w Max. and Min. | Count | Code for "a" | Code for "b" | Code for "r" | Code for "c" | Code for "d" |
|---|---|---|---|---|---|---|---|
| 0x61 | 0x11 | 5 | 0 | 1 | 17 | 2 | 3 |

FIG. 2B

| Offset | Code |
|---|---|
| 0 | 0 |
| 1 | 1 |
| 2 | 2 |
| 3 | 3 |
| 4 | 4 |
| ... | ... |
| 17 | 17 |
| ... | ... |
| 31 | 31 |

FIG. 4A

| Offset | Code |
|---|---|
| 0 | 1 |
| 1 | 2 |
| 2 | 3 |
| 3 | 4 |
| ... | ... |
| 16 | 17 |
| ... | ... |
| 30 | 31 |

FIG. 4B

| Offset | Code |
|---|---|
| 0 | 2 |
| 1 | 3 |
| 2 | 4 |
| ... | ... |
| 15 | 17 |
| ... | ... |
| 29 | 31 |

FIG. 4C

| Offset | Code |
|---|---|
| 0 | 2 |
| 1 | 3 |
| 2 | 4 |
| ... | ... |
| 28 | 31 |

FIG. 4D

| Offset | Code |
|---|---|
| 0 | 3 |
| 1 | 4 |
| 2 | 5 |
| ... | ... |
| 27 | 31 |

FIG. 4E

| Offset | Code |
|---|---|
| 0 | 4 |
| 1 | 5 |
| 2 | 6 |
| ... | ... |
| 26 | 31 |

FIG. 4F

| Min. Value | Diff. b/w Max. and Min. | Count | Code for "a" | Code for "b" | Code for "r" | Code for "c" | Code for "d" |
|---|---|---|---|---|---|---|---|
| 0x61 | 0x11 | 5 | 0 | 0 | 15 | 0 | 0 |

FIG. 4G

```
Bignum *code_values(unsigned int offsets[], int len, int max)
{
    Bignum *res = BN_zero();
    int i;
    int counter = max - 1;

for(i=0; i<len; i++)
    {
        BN_add_scalar(res, offsets[i]);
        if ((len – 1) == i)
            return res;
        BN_mul_scalar(res, counter--);
    }

/* If we get to here, len must be <= 0 */
    return res;
}
```

FIG. 7A

```
Bignum * code_values(unsigned int offsets[], int len, int max)
{
    Bignum *res = BN_zero();
    int i;
    int counter = max - 1;

if (len == 0)  /* Check for a zero length */
        return res;

for(i=0; i<len-1; i++)
    {
        BN_mul_scalar(BN_add_scalar(res, offsets[i]), counter--);
        BN_add_scalar(res, offsets[i];
    } return res;
}
```

FIG. 7B

| Offset | Code |
|---|---|
| 0 | 0 |
| 1 | 1 |
| ... | ... |
| 0x61 | 0x61 |
| ... | ... |
| 0x72 | 0x72 |
| ... | ... |
| 0xFF | 0xFF |

FIG. 8A

| Offset | Code |
|---|---|
| 0 | 0 |
| 1 | 1 |
| ... | ... |
| 0x61 | 0x62 |
| ... | ... |
| 0x71 | 0x72 |
| ... | ... |
| 0xFE | 0xFF |

FIG. 8B

| Offset | Code |
|---|---|
| 0 | 0 |
| 1 | 1 |
| ... | ... |
| 0x61 | 0x63 |
| ... | ... |
| 0x70 | 0x72 |
| ... | ... |
| 0xFD | 0xFF |

FIG. 8C

| Offset | Code |
|---|---|
| 0 | 0 |
| 1 | 1 |
| ... | ... |
| 0x61 | 0x63 |
| ... | ... |
| 0xFC | 0xFF |

FIG. 8D

| Offset | Code |
|---|---|
| 0 | 0 |
| 1 | 1 |
| ... | ... |
| 0x61 | 0x64 |
| ... | ... |
| 0xFB | 0xFF |

FIG. 8E

| Offset | Code |
|---|---|
| 0 | 0 |
| 1 | 1 |
| ... | ... |
| 0x61 | 0x65 |
| ... | ... |
| 0xFA | 0xFF |

FIG. 8F

| Min. Value | Diff. b/w Max. and Min. | Count | Code for "a" | Code for "b" | Code for "r" | Code for "c" | Code for "d" |
|---|---|---|---|---|---|---|---|
| 0x61 | 0x10 | 5 | 0 | 0 | 15 | 0 | 0 |

FIG. 8G

COMPACT ENCODING OF NON-REPEATING SEQUENCES

TECHNICAL FIELD

Embodiments of the present invention relate to data encoding, and more specifically to data encoding rules that compactly encode of non-repeating sequences of small integer values.

BACKGROUND

To conserve resources on computing devices, data compression techniques are often implemented. Common compression techniques include range coding and Huffman coding.

Range coding achieves compression by converting a data stream into a floating point representation of the notional probability that the data stream would occur, based on the model used by the coder. Huffman coding achieves compression by replacing common fixed-size bit sequences in a data stream with shorter bit sequences, and uncommon bit sequences with longer bit sequences, that have the property that no valid replacement bit sequence is a prefix of any other valid replacement.

Both coding techniques generate small sets of nonrepeating integer values that need to be stored for or transmitted to the decoding application. Thus, a technique to compactly store or transmit these sets is required.

BRIEF DESCRIPTION OF THE DRAWINGS

The present invention is illustrated by way of example and not limitation in the figures of the accompanying drawings in which like references indicate similar elements.

FIG. 2A is a diagram illustrating certain representations of a sequence of non-repeating data values which may be used with an embodiment of the invention.

FIG. 2B is a diagram illustrating an encoded stream according to one embodiment of the invention.

FIGS. 4A-4G are diagrams illustrating encoding techniques according to another embodiment of the invention.

FIGS. 7A-7B are pseudo codes for encoding non-repeating data values according to certain embodiments of the invention.

FIGS. 8A-8G are diagrams illustrating encoding techniques according to another embodiment of the invention.

DETAILED DESCRIPTION

In the following description, numerous details are set forth to provide a more thorough explanation of the embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment.

Figure 1:
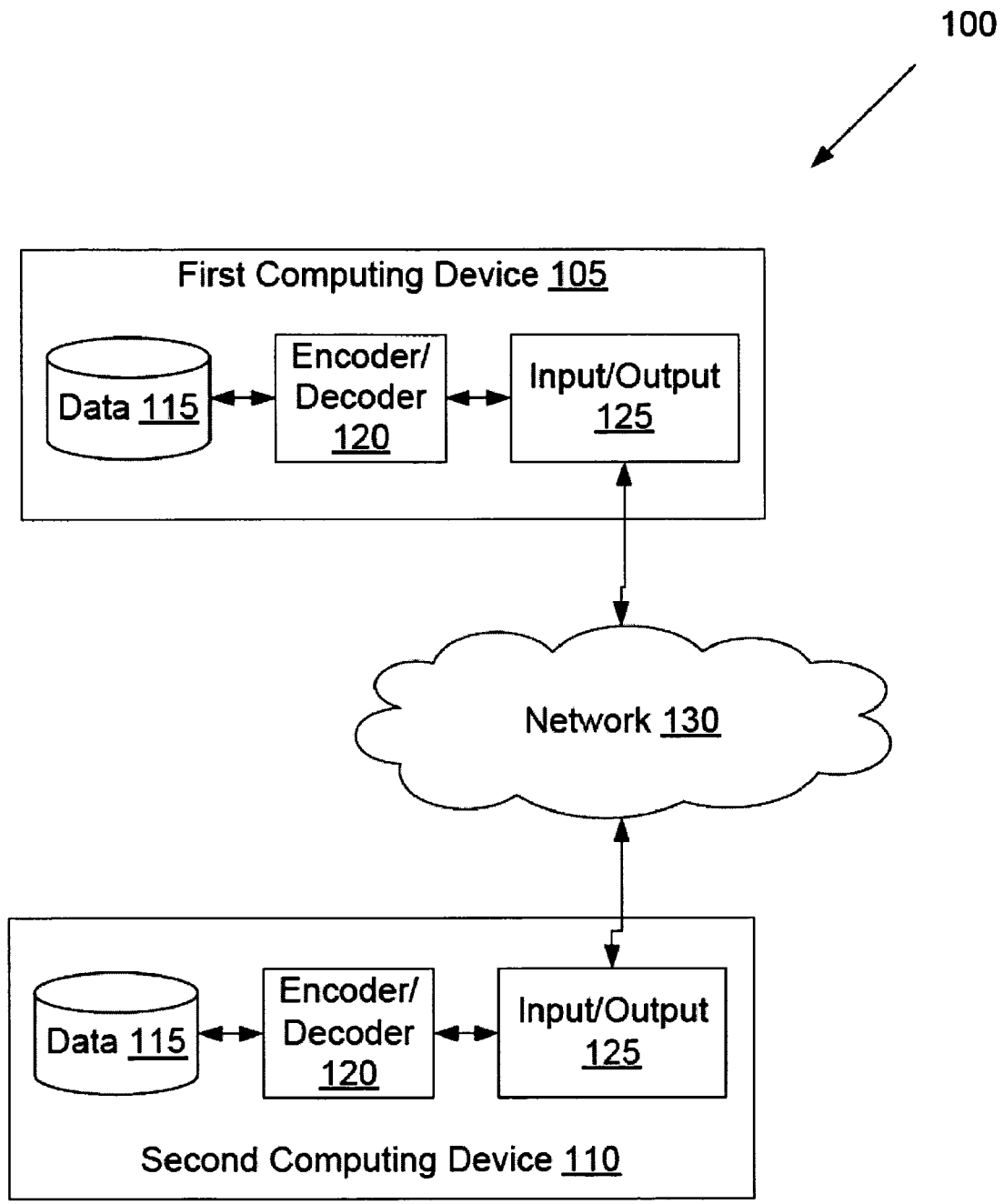
FIG. 1 illustrates an exemplary network architecture 100 in which embodiments of the present invention may operate.

FIG. 1 illustrates an exemplary network architecture 100 in which embodiments of the present invention may operate. The network architecture 100 may include a first computing device 105 and a second computing device 110 connected via a network 130. The network may be a public network (e.g., the Internet) or a private network (e.g., a local area network (LAN), intranet, intraweb, etc.).

Each of the first computing device 105 and second computing device 110 may be a desktop computer, notebook computer, cellular phone, personal digital assistant (PDA), or other device capable of processing machine-executable code. Moreover, the first computing device 105 and second computing device 110 may each operate as a client or server in a client-server environment, or as a peer in a peer-to-peer environment. In one embodiment, the first computing device 105 and second computing device 110 each include data 115, an encoder 120, and an input/output unit 125.

Data 115 may be data of arbitrary size, and may be stored in a storage medium such as a hard disk drive, random access memory (RAM), read only memory (ROM), optical media, magnetic media, etc. Encoder/decoder 120 may be connected with a storage medium that includes data 115. Encoder/decoder 120 may compactly encode data for transmission or storage, and decode received or read data. Encoded data may be transmitted and received using input/output 125, with which encoder/decoder 120 is connected. Note that encoder/decoder 120 may include processing logic which may include software, hardware, or a combination of both.

According to certain embodiments of the invention, a basic technique is to determine the highest and lowest value of a sequence of non-repeating data values to be encoded and how many values are to be encoded. Then, the lowest value is encoded as an integer. In addition, the difference between the highest and lowest values is encoded as an integer representing the base-2 logarithm of the difference and rounded up (e.g., the number of bits needed to represent the difference in binary). This is followed by an integer count of the number of elements being encoded. If an encoder is operating on 8-bit byte values, the first data encoded (e.g., the lowest value of the sequence) would require 8 bits, the second data encoded (e.g., the difference between the highest and lowest values) would require 3 bits, and the third data encoded (e.g., the integer count) would require as many bits as the count in the second field having the second data encoded.

These integers may, for example, code the characters occurring in a text string (e.g., "abracadabra") on their first occurrence in the string (e.g., "abrcd"). Such a string of non-repeating integer values may occur in the context of data compression. For example, certain data compression techniques to generate such non-repeating sequence of data can be found in co-pending U.S. patent application Ser. No. 12/072,811, entitled "Difference Coding Adaptive Context Model", filed Feb. 28, 2008, and U.S. patent application Ser. No. 12/072,760, entitled "Bidirectional Context Model for Adaptive Compression", filed Feb. 28, 2008, which are incorporated by reference herein in their entirety. Embodiments of the present application are related to techniques to encode and/or compress a literal stream having non-repeating literals which may be generated from any one of the above incorporated by reference applications.

For the purposes of illustration, a non-repeating sequence of "abrcd", each being represented by an American standard code for information interchange (ASCII) code as shown in FIG. 2A. Note that it is important to realize that the values being coded can be anything, not necessarily a set of ASCII values for characters, although that may be the motivation.

The string of characters "abrcd" would be represented in ASCII as 0x61, 0x62, 0x72, 0x63, and 0x64, respectively (in hexadecimal—the decimal values are 97, 98, 114, 99, and 100, respectively), as shown in FIG. 2A. The lowest value in this example set is 97 (0x61, in hexadecimal). The difference between the largest and smallest value is 17 decimal (0x11, in hex). This value would take 5 bits to encode. So, as shown in FIG. 2B, the first eleven bits would be 0110 0001 101, where the 0110 0001 represents the first value (e.g., 97, or 0x61 in hex) in the first field. The "101" binary value represents 5 in decimal in the second field, which is the number of bits required to encode each offset. The third field is the same width as the size encoded in that three-bit field (e.g., 5 bits), and it encodes the number of items in the set (or 5, in this example). So, as a preamble of the output stream, the first 16 bits would be 0110 0001 1010 0101. Then, each difference from the smallest value would be computed and encoded (in order), which would result in a sequence of decimal values of 0, 1, 17, 2, and 3, as shown in FIG. 2B.

Figure 3A:
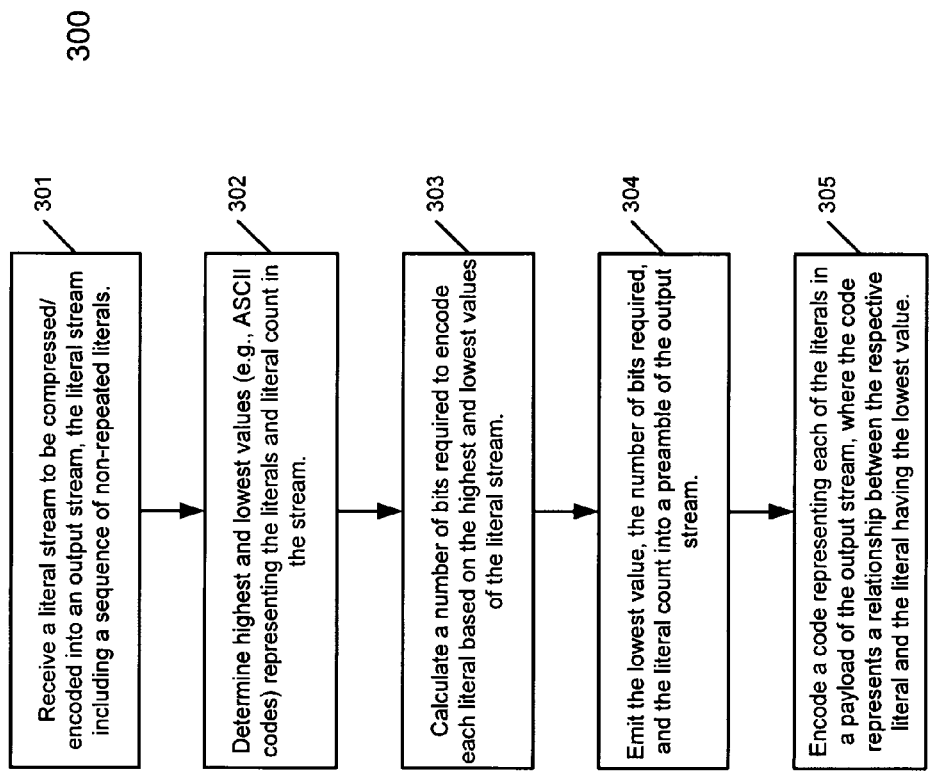
FIGS. 3A-3B are flow diagrams illustrating processes for encoding and decoding non-repeating data values according to certain embodiments of the invention.

FIG. 3A is a flow diagram illustrating a process for encoding a non-repeating sequence according to one embodiment of the invention. Note that process 300 may be performed by processing logic which may include software, hardware, or a combination of both. For example, process 300 may be performed by encoder/decoder 120 of FIG. 1. Referring to FIG. 3A, at block 301, a literal stream having a sequence of non-repeating literals is received. Such a literal stream may be generated by a variety of encoding and/or compression techniques as described in the above-identified co-pending applications. At block 302, the highest and lowest values (e.g., ASCII codes) representing the literals in the sequence are determined, as well as the literal count representing a number of literals in the stream. At block 303, a number of bits required to encode each literal is calculated based on the highest and lowest values of the literal stream. In one embodiment, a base-two logarithm operation with rounding up may be performed on the value representing the difference between the highest value and lowest value to determine the number of bits required. At block 304, the lowest value, the number of bits required, and the literal count are emitted or encoded into an output stream as a first, second, and third fields which resembles a preamble of the output stream. At block 305, each literal in the literal stream is encoded via its respective representative code into a payload of the output stream, where a representative code represents a relationship between the respective literal and the literal associated with the encoded lowest value. In one embodiment, the representative code is determined based on a difference between the code value (e.g., ASCII code) representing the respective literal and the encoded lowest value.

Figure 3B:
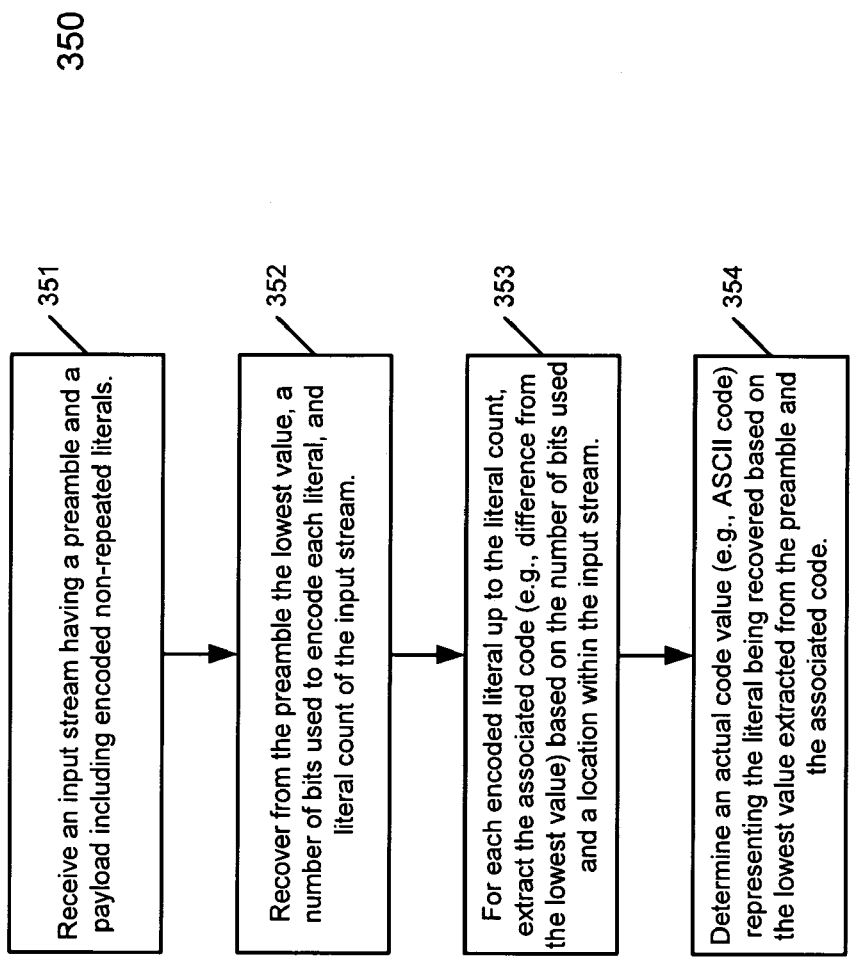

FIG. 3B is a flow diagram illustrating a process for decoding a non-repeating sequence according to one embodiment of the invention. Note that process 350 may be performed by processing logic which may include software, hardware, or a combination of both. For example, process 350 may be performed by encoder/decoder 120 of FIG. 1. Referring to FIG. 3B, at block 351, an input stream having a preamble and a payload including a sequence of non-repeating literals encoded therein. For example, such input stream may be constructed by an encoder according to techniques as shown in FIG. 3A. At block 352, processing logic recovers the lowest value, a number of bits used to encode each literal, and the literal count from the preamble of the input stream. For each literal up to the literal count, at block 353, processing logic extracts the associated code (e.g., difference from the encoded lowest value) based on a location derived from the number of bits used for encoding from the input stream. At block 354, processing logic determines the actual code value (e.g., ASCII code) representing a literal being decoded based on the extracted lowest value and the associated code. In one embodiment, the actual code value may be recovered by adding the extracted associated code with the extracted lowest value.

Note that the above processes are described for illustration purposes only. There are a few possibilities on how to encode these values. They can just be encoded in five bits each, leading to an encoding that takes 41 bits (one more than the original set). They can be represented by offsets into a shrinking possibility table, and just the number of bits required to code the offsets would be used (again, for this set, it would result in 41 bits).

FIGS. 4A-4G are diagram illustrating a process for encoding non-repeating literals using a shrinking possibility table according to one embodiment of the invention. To get the offsets, a possibility table is constructed and initialized from zero to the highest value that can be represented with the number of bits an encoder might have. In the example of "abrcd", the highest value would be 31 for the illustration purposes, as shown in FIG. 4A. Then, starting with the first difference, the encoder finds and encodes the offset of the value in the table, and then removes that entry from the table.

For the example of coding a sequence of 0, 1, 17, 2, and 3, which represents literals "abrcd", the encoder starts with a possibility table as shown in FIG. 4A, where each difference value is the same as its offset in the table. When encoding the first value of "0" (representing literal "a"), the encoder looks up entries of the table from FIG. 4A, which corresponds to entry 0. As a result, the offset of entry 0 (e.g., value of 0) is encoded into the output stream and the corresponding entry is popped or removed from the table, as shown in FIG. 4B. Note that in FIG. 4B, since the first entry has been removed, the rest of the entries after the removed entry are moved up by one offset. For example, the original entry having code value of "1" is now at offset 0 and so on.

When encoding the second value of "1" (representing literal "b"), the encoder looks up entries of the table from FIG. 4B, which corresponds to entry 0. As a result, the offset of entry 0 (e.g., value of 0) is encoded into the output stream and the corresponding entry is popped or removed from the table, as shown in FIG. 4C. Note that in FIG. 4C, since the first entry has been removed, the rest of the entries after the removed entry are moved up by one offset. For example, the original entry having code value of "2" is now at offset 0 and so on.

When encoding the third value of "17" (representing literal "r"), the encoder looks up entries of the table from FIG. 4C, which corresponds to entry 15 having a code value of 17. As a result, the offset of entry 15 (e.g., value of 15) is encoded into the output stream and the corresponding entry is popped or removed from the table, as shown in FIG. 4D. Note that in FIG. 4D, since the entry 15 has been removed, the rest of the entries after the removed entry 15 are moved up by one offset, while the entries before the removed entry remain at the same offsets.

When encoding the next value of "2" (representing literal "c"), the encoder looks up entries of the table from FIG. 4D, which corresponds to entry 0. As a result, the offset of entry 0 (e.g., value of 0) is encoded into the output stream and the corresponding entry is popped or removed from the table, as shown in FIG. 4E. Note that in FIG. 4E, since the first entry has been removed, the rest of the entries after the removed entry are moved up by one offset. For example, the original entry having code value of "3" is now at offset 0 and so on.

When encoding the next value of "3" (representing literal "d"), the encoder looks up entries of the table from FIG. 4E, which corresponds to entry 0. As a result, the offset of entry 0 (e.g., value of 0) is encoded into the output stream and the corresponding entry is popped or removed from the table, as shown in FIG. 4F. Note that in FIG. 4F, since the first entry has been removed, the rest of the entries after the removed entry are moved up by one offset. For example, the original entry having code value of "4" is now at offset 0 and so on. Therefore, the final output stream would have a payload of "0, 0, 15, 0, and 0" as shown in FIG. 4G.

Figure 5A:
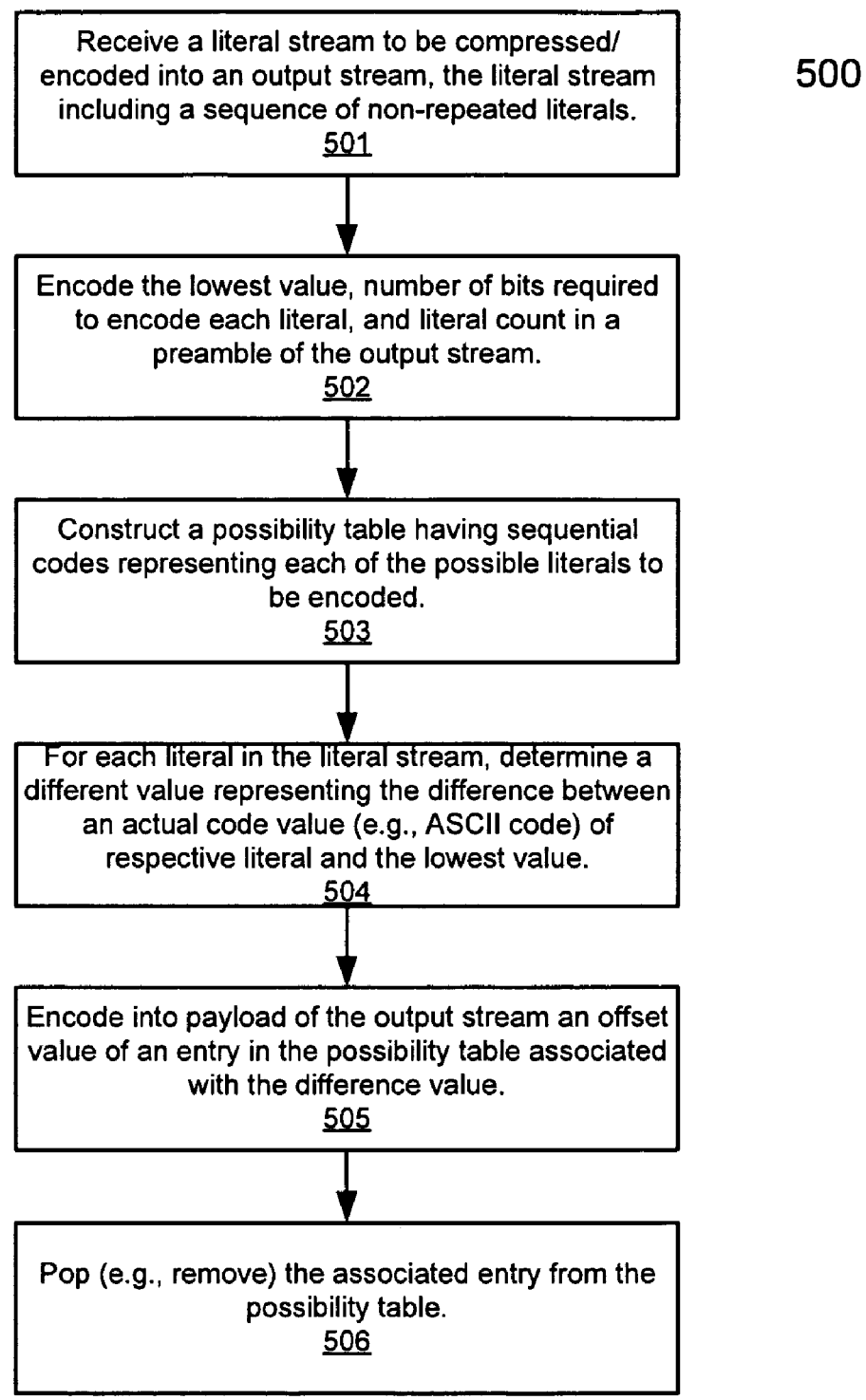
FIGS. 5A-5B are flow diagrams illustrating processes for encoding and decoding non-repeating data values according to another embodiment of the invention.

FIG. 5A is a flow diagram illustrating a process for encoding literals using a shrinking possibility table according to one embodiment of the invention. Note that process 500 may be performed by processing logic which may include software, hardware, or a combination of both. For example, process 500 may be performed by encoder/decoder 120 of FIG. 1. Referring to FIG. 5A, at block 501, a literal stream is received to be encoded or compressed into an output stream. The literal stream includes a sequence of non-repeating literals. Similar to process 300 of FIG. 3A, at block 502, the lowest value, a number of bits required to encode each literal, and the literal count are determined from the literal stream and encoded as a preamble of the output stream. At block 503, a possibility table is constructed and initialized as shown in FIG. 4A. At block 504, for each literal in the literal stream, a value representing a difference between an actual data valued (e.g., ASCII code) representing the respective literal and the lowest value is determined. At block 505, processing logic looks up in the shrinkable possibility table to locate an entry having a code value equivalent to the difference value and encodes an offset of the identified entry into the payload of the output stream. Thereafter, at block 506, the corresponding entry is popped or removed from the possibility table, and the iterative process repeats until all of the literals have been encoded using the possibility table.

Figure 5B:
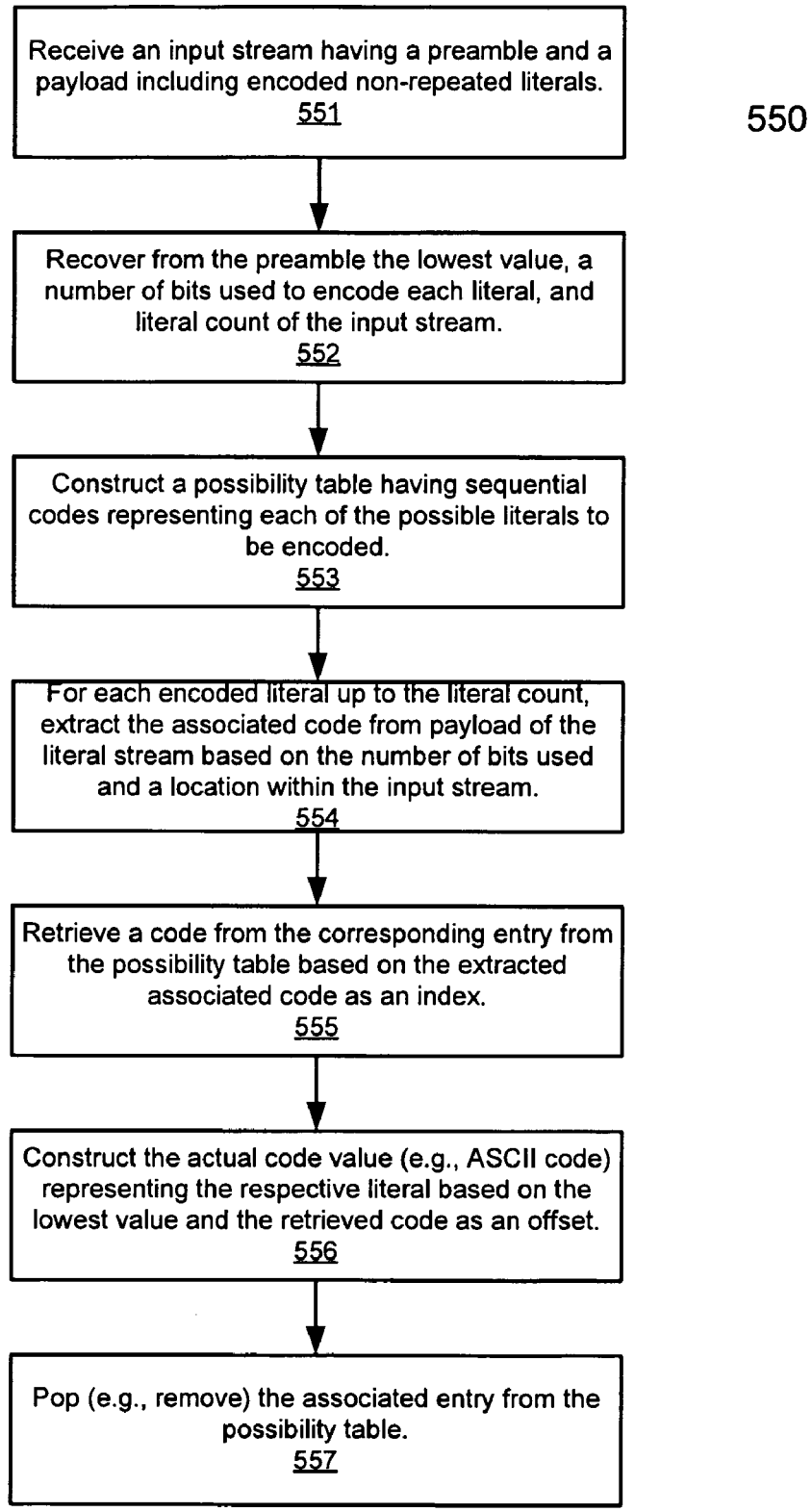

FIG. 5B is a flow diagram illustrating a process for decoding non-repeating literals using a possibility table according to one embodiment of the invention. Note that process 550 may be performed by processing logic which may include software, hardware, or a combination of both. For example, process 550 may be performed by encoder/decoder 120 of FIG. 1. Referring to FIG. 5B, at block 551, an input stream having a preamble and a payload including a sequence of non-repeating literals encoded therein. For example, such input stream may be constructed by an encoder according to techniques as shown in FIG. 5A. At block 552, processing logic recovers the lowest value, a number of bits used to encode each literal, and the literal count from the preamble of the input stream.

At block 553, a possibility table is constructed and initialized. For each literal up to the literal count, at block 554, processing logic extracts the associated code (e.g., difference from the encoded lowest value) based on a location derived from the number of bits used for encoding from the input stream. At block 555, processing logic looks up the possibility table to identify an entry having an index equivalent to a current encoded value of a current literal and retrieves the code value from the identified entry. At block 556, the processing logic constructs an actual code value (e.g., ASCII code) representing the respective literal based on the lowest value and the retrieved code value. In one embodiment, the actual code value is determined by adding the retrieved code value with the lowest value. Thereafter, the identified entry is popped or removed from the possibility table, and the iterative process repeats until all encoded literals have been processed.

Alternatively, according to an alternatively embodiment, the offsets from the shrinking possibility table can be interpreted as "digits" in a mixed-radix number and the resulting integer value encoded using a compact encoding scheme.

A number in a positional numbering system can actually be viewed as forming a polynomial expression, with the base of the number system being the value at which the polynomial is evaluated. For example, the number 234 can be thought of as $2x^2+3x+4$, with $x=10$. A mixed radix system is similar, except instead of a single variable, there may be multiple variables. Thus, the value of 234 could actually be thought of as $2x+3y+4$. In the case of the offset codes derived above, we would have the expression of $0w+0x+15y+0z+0$ for encoding "0, 0, 15, 0, 0". If we pick a suitable set of w, x, y, and z, we could evaluate the expression for those values and have an integer that uniquely represents those five values.

The appropriate values to use can be determined from the observation that the first value must be in the range 0-31, the second in 0-30 (after removing one entry), the third, 0-29 (after removing two entries), the fourth, 0-28, and the fifth, 0-27, and so on. Since the fifth value can be anything up to and including 27, in order for the encoding to uniquely represent the codes given, "z" must be at least one larger than 27. Since we want as small an integer as possible, we would need to select the smallest possible "z", or z=28. Going from there, the fourth value can be as large as 28, and "z" is 28. As a result, we need a value for "y" that is at least one larger than 28*28+27. The smallest value needed here would be 28*29, or 812. The third value can be as large as 29, implying an "x" value of 28*29*30=24,360. The value for "w" would be 28*29*30*31=755,160.

Figure 6A:
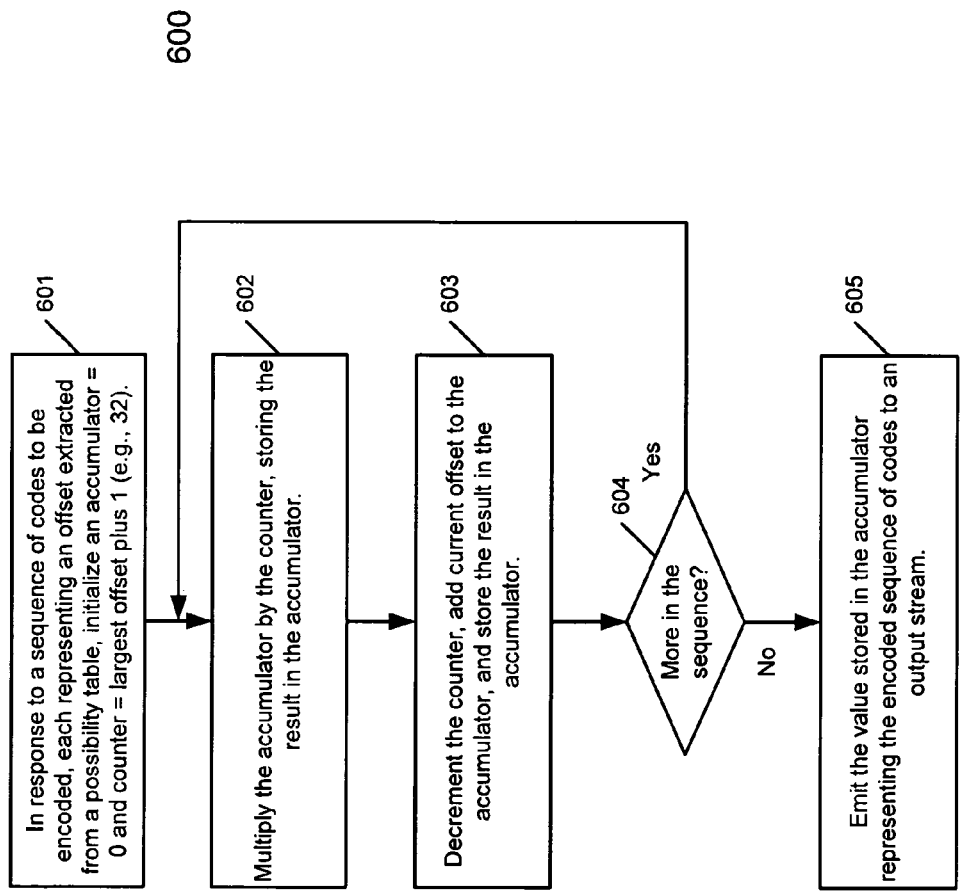
FIGS. 6A-6B are flow diagrams illustrating processes for encoding non-repeating data values according to other embodiments of the invention.

FIG. 6A is a flow diagram illustrating a process for encoding values using a mixed radix system according to one embodiment of the invention, which may be performed by processing logic having software, hardware, or a combination of both. Referring to FIG. 6A, in response to a sequence of code to be encoded, each representing an offset extracted from a possibility table, at block 601, an accumulator and a counter are initialized as zero and the largest offset plus one (e.g., 32). At block 602, processing logic multiplies the value stored in the accumulator with the value stored in the counter, and stores the result back in the accumulator (e.g., accumulator=accumulator*counter). At block 603, the counter is decremented (e.g., counter=counter−1). In addition, the current offset value is added into the accumulator (e.g., accumulator=accumulator+current offset). If there are more in the sequence, at block 604, the above process repeats. When all values have been encoded, the value stored in the accumulator is emitted to the output stream to represent the encoded sequence.

With the example set of "0, 0, 15, 0, 0" above, the accumulator and the counter are initialized as follows:

Accumulator=0;

Counter=32; /*largest offset of 31 plus 1*/

In view of a next offset of 0 (representing "a"), the processing logic performs the followings:

Accumulator=Accumulator*Counter=32*0=0;

Counter=Counter−1=31;

Accumulator=Accumulator+current offset=0+0=0;

In view of a next offset of 0 (representing "b"), the processing logic performs the followings:

Accumulator=Accumulator*Counter=31*0=0;

Counter=Counter−1=30;

Accumulator=Accumulator+current offset=0+0=0;

In view of a next offset of 15 (representing "r"), the processing logic performs the followings:

Accumulator=Accumulator*Counter=30*0=0;

Counter=Counter−1=29;

Accumulator=Accumulator+current offset=0+15=15;

In view of a next offset of 0 (representing "c"), the processing logic performs the followings:

Accumulator=Accumulator*Counter=29*15=435;

Counter=Counter−1=28;

Accumulator=Accumulator+current offset=435+0=435;

In view of a next offset of 0 (representing "d"), the processing logic performs the followings:

Accumulator=Accumulator*Counter=435*28=12180;

Counter=Counter−1=27;

Accumulator=Accumulator+current offset=12180+0=12180;

Thus, we can represent "0, 0, 15, 0, 0" uniquely as 12180, which can be encoded using a variety of encoding techniques for encoding data with arbitrary sizes. In one embodiment, data of arbitrary size is divided into one or more data blocks. The data blocks may have a predetermined size (e.g., 8 bits, 16 bits, etc.). One or more length blocks are generated that include length information identifying the quantity of the data blocks into which the data is divided. The one or more length blocks may have the predetermined size of the data blocks. The length information may be determined by a number of reads of the length blocks and without examining data blocks that do not include length information. Moreover, the number of length blocks may be determined without examining all of the length blocks. In one embodiment, the length information can be determined by at most three reads for non-recursive encodings. The data blocks and the length blocks may then be transmitted to a destination. Further details regarding these techniques can be found in a co-pending U.S. patent application Ser. No. 11/881,527, entitled "Compact Encoding of Arbitrary Length Binary Objects," filed Jul. 27, 2007, which is incorporated by reference in its entirety.

Figure 6B:
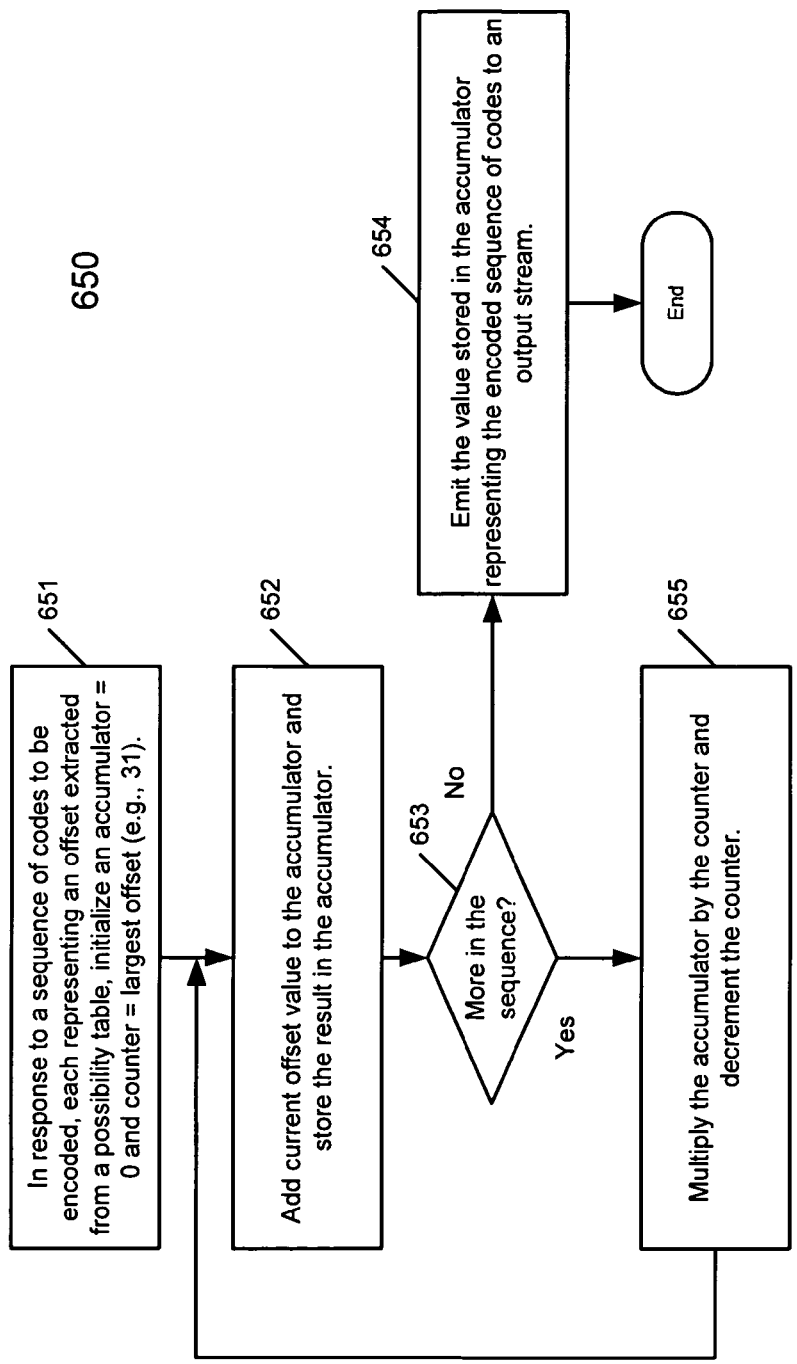

For example, using one of the rules from the above identified application, this value can be represented in 3 octets—1001 0100 1111 1001 0000 0010. In addition, an unnecessary multiplication may be saved by moving the multiplication and decrement operations down below the termination operation. FIG. 6B is a flow diagram illustrating such an alternatively embodiment of encoding process. Again, process 650 may be performed by processing logic which may include software, hardware, or a combination of both. Referring to FIG. 6B, in response to a sequence of codes (e.g., offsets) to be encoded, at block 651, processing logic initializes an accumulator as zero and a counter as largest possible offset plus one. At block 652, a current offset is added to the accumulator. If no more code left at block 653, the value stored in the accumulator is emitted into the output stream at block 654. If there are still more codes to be encoded, at block 655, the accumulator is multiplied with the counter and the result is stored back in the accumulator.

Examples of pseudo codes implementing or representing the above processes are shown in FIGS. 7A-7B. Referring to FIGS. 7A-7B, this assumes there is a big integer math package that uses structures of type Bignum and provides the operations BN_add_scalar and BN_mul_scalar to add and multiply unsigned integer values into the big integer, and that BN_zero( ) returns a freshly-constructed Bignum with a value of zero.

To decode the value into offsets, a decoder will starts with the value of 28, which is determined based on the maximum offset size (e.g., 31), decreased by the number of values in the set (e.g., 5), plus 2. The value of 2 comes from the facts that we have one more than the maximum offset size values we need to represent and we need both ends of the range of values for the division operations. The decoder divides the value by successively larger values and queues up the remainders. In this example, the processing logic associated with the decoder will performs the following operations:

12180/28==435, remainder 0

435/29==15, remainder 0

15/30==0, remainder 15

0/31==0, remainder 0 where queuing up the final division result and the remainders in reversed order resulted in 0, 0, 15, 0, 0.

To avoid multiple precision integer math, where this encoding could require integers with thousands of bits of precision, the offsets can be encoded individually in a decreasing number of bits. For the above example with a maximum difference of 31, the first 16 values could be encoded in 5 bits each. The succeeding 8 values (which could not have values greater than 15) would require 4 bits each. The succeeding 4 values would require 3 bits, the succeeding 2 values, 2 bits, and the next value, 1 bit. If 32 total values are encoded, the last value could only have a single possible value, so the final value would not need to be explicitly encoded.

For comparison purposes: using discrete bit encoding with a shrinking field (as outlined in the preceding paragraphs), one could use as many as 1,793 bits to encode whatever information that an 8-bit octet can encode, plus 19 bits of header information, for a grand total of 1812 bits (encoding 2048 bits of information). For the mixed radix integer, the largest possible value is 256!, or about $8.58*10^{506}$, which would require 1684 bits to represent as a binary string, plus overhead of 20 bits (using one of the rules described in the above incorporated by reference application), or 1704 bits, representing the maximum size of the encoded integer, plus additional 19 bits of header information (e.g., an 8-bit encoding of zero, value 0 encoded in 3 bits, and the value 255 encoded in 8 bits).

FIGS. 8A-8G are diagram illustrating a process for encoding non-repeating literals using a shrinking possibility table according to one embodiment of the invention. To get the offsets, a possibility table is constructed and initialized from zero to the highest value that can be represented with the number of bits an encoder might have. In the example of ASCII characters that can be encoded in a 8-bit value, a shrinking table would include entries 0-255 as shown in FIG. 8A. Unlike the approach shown in FIGS. 4A-4G, in this embodiment, the actual ASCII codes are used in the table. Then, starting with the first ASCII code representing the first literal, the encoder finds and encodes the offset of the ASCII code in the table, and then removes that entry from the table.

For the example of coding a sequence of 0x61, 0x62, 0x72, 0x63, and 0x64, which represents literals "abrcd", the encoder starts with a possibility table as shown in FIG. 8A. When encoding the first value of 0x61 (representing literal "a"), the encoder looks up entries of the table from FIG. 8A, which corresponds to entry 0x61. As a result, the offset of entry 0x61 (e.g., value of 0x61) is encoded into the output stream and the corresponding entry is popped or removed from the table, as shown in FIG. 8B. Note that in FIG. 8B, since the entry 0x61 has been removed, the rest of the entries after the removed entry are moved up by one offset, while the entries before the removed entry remain at the same offsets. For example, the original entry having code value of 0x62 is now at offset 0x61 and so on.

When encoding the second value of 0x62 (representing literal "b"), the encoder looks up entries of the table from FIG. 8B, which corresponds to the entry having an offset of 0x61. As a result, the offset of entry 0x61 (e.g., value of 0x61) is encoded into the output stream and the corresponding entry is popped or removed from the table, as shown in FIG. 8C. Note that in FIG. 8C, since the entry has been removed, the rest of the entries after the removed entry are moved up by one offset, while the entries before the removed entry remain at the same offsets. For example, the original entry having code value of 0x63 is now at offset 0x61 and so on.

When encoding the third value of 0x72 (representing literal "r"), the encoder looks up entries of the table from FIG. 8C, which corresponds to entry 0x70 having a code value of 0x72. As a result, the offset of entry 0x70 (e.g., value of 0x70) is encoded into the output stream and the corresponding entry is popped or removed from the table, as shown in FIG. 8D. Note that in FIG. 8D, since the entry 0x70 has been removed, the rest of the entries after the removed entry 0x70 are moved up by one offset, while the entries before the removed entry remain at the same offsets.

When encoding the next value of 0x63 (representing literal "c"), the encoder looks up entries of the table from FIG. 8D, which corresponds to entry 0x61. As a result, the offset of entry 0x61 (e.g., value of 0x61) is encoded into the output stream and the corresponding entry is popped or removed from the table, as shown in FIG. 8E. Note that in FIG. 8E, since the entry has been removed, the rest of the entries after the removed entry are moved up by one offset, while the entries before the removed entry remain at the same offsets. For example, the original entry having code value of 0x64 is now at offset 0x61 and so on.

When encoding the next value of 0x64 (representing literal "d"), the encoder looks up entries of the table from FIG. 8E, which corresponds to entry 0x61 again. As a result, the offset of entry 0x61 (e.g., value of 0x61) is encoded into the output stream and the corresponding entry is popped or removed from the table, as shown in FIG. 8F. Therefore, the final output stream would have a payload of "0x61, 0x61, 0x70, 0x61, and 0x61". Before finally storing the encoded codes into the output stream, the final code is represented by a difference between the code of each literal (e.g., offset value obtained from the table) and the minimum value code (e.g., 0x61), in this example, a sequence of "0, 0, 15, 0, 0," as shown in FIG. 8G.

Figure 9:
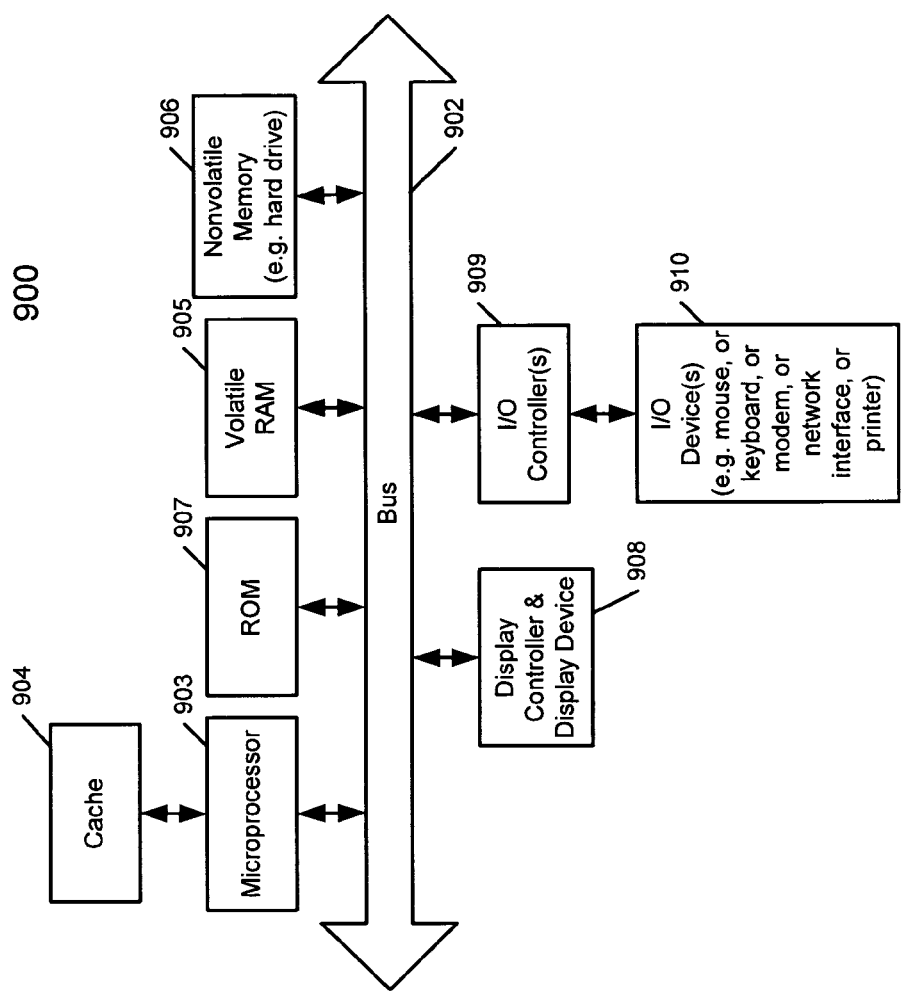
FIG. 9 illustrates a diagrammatic representation of a machine in the exemplary form of a computer system which may be used with an embodiment of the invention.

FIG. 9 illustrates a diagrammatic representation of a machine in the exemplary form of a computer system within which a set of instructions, for causing the machine to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. For example, the system 900 may be used as part of system, either an encoder or a decoder, to perform the coding processes set forth above.

As shown in FIG. 9, the system 900, which is a form of a data processing system, includes a bus or interconnect 902 which is coupled to one or more microprocessors 903 and a ROM 907, a volatile RAM 905, and a non-volatile memory 906. The microprocessor 903 is coupled to cache memory 904 as shown in the example of FIG. 9. Processor 903 may be, for example, a PowerPC microprocessor or an Intel compatible processor. Alternatively, processor 903 may be a digital signal processor or processing unit of any type of architecture, such as an ASIC (Application-Specific Integrated Circuit), a CISC (Complex Instruction Set Computing), RISC (Reduced Instruction Set Computing), VLIW (Very Long Instruction Word), or hybrid architecture, although any appropriate processor may be used.

The bus 902 interconnects these various components together and also interconnects these components 903, 907, 905, and 906 to a display controller and display device 908, as well as to input/output (I/O) devices 910, which may be mice, keyboards, modems, network interfaces, printers, and other devices which are well-known in the art.

Typically, the input/output devices 910 are coupled to the system through input/output controllers 909. The volatile RAM 905 is typically implemented as dynamic RAM (DRAM) which requires power continuously in order to refresh or maintain the data in the memory. The non-volatile memory 906 is typically a magnetic hard drive, a magnetic optical drive, an optical drive, or a DVD RAM or other type of memory system which maintains data even after power is removed from the system. Typically, the non-volatile memory will also be a random access memory, although this is not required.

While FIG. 9 shows that the non-volatile memory is a local device coupled directly to the rest of the components in the data processing system, embodiments of the present invention may utilize a non-volatile memory which is remote from the system; such as, a network storage device which is coupled to the data processing system through a network interface such as a modem or Ethernet interface. The bus 902 may include one or more buses connected to each other through various bridges, controllers, and/or adapters, as is well-known in the art. In one embodiment, the I/O controller 909 includes a USB (Universal Serial Bus) adapter for controlling USB peripherals. Alternatively, I/O controller 909 may include an IEEE-1394 adapter, also known as FireWire adapter, for controlling FireWire devices.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the present invention also relate to an apparatus for performing the operations herein. This apparatus may be specially constructed for the required purposes, or it may comprise a general-purpose computer selectively activated or reconfigured by a computer program stored in the computer. Such a computer program may be stored in a computer readable medium. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., carrier waves, infrared signals, digital signals, etc.)), etc.

The algorithms and displays presented herein are not inherently related to any particular computer or other apparatus. Various general-purpose systems may be used with programs in accordance with the teachings herein, or it may prove convenient to construct more specialized apparatus to perform the required method operations. The required structure for a variety of these systems will appear from the description below. In addition, embodiments of the present invention are not described with reference to any particular programming language. It will be appreciated that a variety of programming languages may be used to implement the teachings of embodiments of the invention as described herein.

In the foregoing specification, embodiments of the invention have been described with reference to specific exemplary embodiments thereof. It will be evident that various modifications may be made thereto without departing from the broader spirit and scope of embodiments of the invention as set forth in the following claims. The specification and drawings are, accordingly, to be regarded in an illustrative sense rather than a restrictive sense.

What is claimed is:

1. A computer method for encoding non-repeating data values, the method comprising:
receiving an input stream having a plurality of non-repeating literals to be encoded into an output stream having a preamble and a payload, each of the non-repeating literal being represented by a unique data value;
identifying a lowest value among data values representing the plurality of non-repeating literals to be encoded and a literal count representing a number of the plurality of non-repeating literals to be encoded;
determining a bit count representing a number of bits required to encode each of the non-repeating literals;
emitting the lowest value, the literal count, and the bit count into the preamble of the output stream; and
for each literal of the input stream, emitting into the payload of the output stream a code value representing a predetermined relationship between the data value associated with each literal and the identified lowest value.

2. The method of claim 1, wherein determining a bit count representing a number of bits required to encode each of the plurality of non-repeating literals comprises:
identifying a highest value among the data values representing the plurality of non-repeating literals; and
performing a predetermined mathematical operation between the highest value and the lowest value to derive the bit count.

3. The method of claim 2, wherein the bit count is performed based on a base-two logarithm operation based on a difference between the highest and lowest values.

4. The method of claim 1, wherein the code value represents a difference between the data value associated with each literal and the identified lowest value.

5. The method of claim 2, wherein the code value represents an index of an entry of a possibility table, the entry having a value representing the difference between the data value associated with each literal and the identified lowest value.

6. The method of claim 5, further comprising:
constructing the possibility table having a plurality of entries, each representing a possible difference between a possible literal and a literal associated with the lowest value;
for each literal, locating an entry in the possibility table that has a value equivalent to the difference between the data value associated with each literal and the identified lowest value;
determining an index associated with the located entry to be used as part of the code value;
removing the located entry from the possibility table; and
sorting remaining entries in the possibility table.

7. The method of claim 5, further comprising generating a bit stream using a mixed base representation to represent each index associated with each literal, and wherein the bit stream is emitted into the payload of the output stream.

8. The method of claim 7, wherein generating a bit stream comprises:
initializing an accumulator as zero and a counter having a value representing a largest possible index of the possibility table;

for each index until all indices have been processed, multiplying the accumulator with the counter and storing a result of multiplication in the accumulator;

decrementing the counter;

adding a current index into the accumulator; and emitting a value stored in the accumulator as a bit stream into the payload of the output stream when all indices have been processed.

9. The method of claim 2, wherein the code value represents an index of an entry of a possibility table, the entry having a value representing each literal.

10. The method of claim 9, further comprising:

constructing the possibility table having a plurality of entries, each representing a possible literal;

for each literal, locating an entry in the possibility table that has a value equivalent to an actual code representing the respective literal;

determining an index associated with the located entry;

emitting an output code representing the respective literal into the output stream, the output code representing a difference between the actual code of the respective literal and the identified lowest value;

removing the located entry from the possibility table; and sorting remaining entries in the possibility table.

11. A machine-readable medium having instructions stored therein, which when executed by a machine, cause the machine to perform a method for encoding non-repeating data values, the method comprising:

receiving an input stream having a plurality of non-repeating literals to be encoded into an output stream having a preamble and a payload, each of the non-repeating literal being represented by a unique data value;

identifying a lowest value among data values representing the plurality of non-repeating literals to be encoded and a literal count representing a number of the plurality of non-repeating literals to be encoded;

determining a bit count representing a number of bits required to encode each of the plurality of non-repeating literals;

emitting the lowest value, the literal count, and the bit count into the preamble of the output stream; and for each literal of the input stream, emitting into the payload of the output stream a code value representing a predetermined relationship between the data value associated with each literal and the identified lowest value.

12. The machine-readable medium of claim 11, wherein determining a bit count representing a number of bits required to encode each of the plurality of non-repeating literals comprises:

identifying a highest value among the data values representing the plurality of non-repeating literals; and performing a predetermined mathematical operation between the highest value and the lowest value to derive the bit count.

13. The machine-readable medium of claim 12, wherein the bit count is performed based on a base-two logarithm operation based on a difference between the highest and lowest values.

14. The machine-readable medium of claim 11, wherein the code value represents a difference between the data value associated with each literal and the identified lowest value.

15. The machine-readable medium of claim 12, wherein the code value represents an index of an entry of a possibility table, the entry having a value representing the difference between the data value associated with each literal and the identified lowest value.

16. The machine-readable medium of claim 15, wherein the method further comprises:

constructing the possibility table having a plurality of entries, each representing a possible difference between a possible literal and a literal associated with the lowest value;

for each literal, locating an entry in the possibility table that has a value equivalent to the difference between the data value associated with each literal and the identified lowest value;

determining an index associated with the located entry to be used as part of the code value;

removing the located entry from the possibility table; and sorting remaining entries in the possibility table.

17. The machine-readable medium of claim 15, wherein the method further comprises generating a bit stream using a mixed base representation to represent each index associated with each literal, and wherein the bit stream is emitted into the payload of the output stream.

18. The machine-readable medium of claim 17, wherein generating a bit stream comprises:

initializing an accumulator as zero and a counter having a value representing a largest possible index of the possibility table;

for each index until all indices have been processed, multiplying the accumulator with the counter and storing a result of multiplication in the accumulator;

decrementing the counter;

adding a current index into the accumulator; and emitting a value stored in the accumulator as a bit stream into the payload of the output stream when all indices have been processed.

19. The machine-readable medium of claim 11, wherein the code value represents an index of an entry of a possibility table, the entry having a value representing each literal.

20. The machine-readable medium of claim 19, wherein the method further comprises:

constructing the possibility table having a plurality of entries, each representing a possible literal;

for each literal, locating an entry in the possibility table that has a value equivalent to an actual code representing the respective literal;

determining an index associated with the located entry;

emitting an output code representing the respective literal into the output stream, the output code representing a difference between the actual code of the respective literal and the identified lowest value;

removing the located entry from the possibility table; and sorting remaining entries in the possibility table.

21. A computer-implemented method for decoding non-repeating data values, the method comprising:

receiving an input stream having a preamble and a payload including a plurality of non-repeating literals encoded therein, each literal being encoded via a unique code value that is different from code values associated with a remainder of the plurality of non-repeating literals;

extracting from the preamble of the input stream a lowest data value among data values that represent the plurality of non-repeating literals, a bit count representing a number of bits required to encode each unique code value, and a literal count representing a number of the plurality of non-repeating literals currently encoded within the input stream;

for each literal up to the literal count, extracting from the payload of the input stream a unique code value associated with each literal, the unique code value representing a predetermined relationship between each literal and a literal associated with the lowest data value; and determining an actual data value representing each literal based on the lowest data value and the unique code value associated with each literal to recover each literal.

22. The method of claim 21, wherein the associated unique code value is extracted from a location determined based on the bit count and a sequential position within the plurality of non-repeating literals, and wherein the actual data value is determined by adding the associated unique code value with the lowest data value.

23. The method of claim 21, wherein the unique code value represents an index of an entry of a possibility table, the entry having a value representing the difference between a data value associated with each literal and the lowest value.

24. The method of claim 23, further comprising:

constructing the possibility table having a plurality of entries, each representing a possible difference between a possible literal and a literal associated with the lowest value;

for each literal, locating an entry in the possibility table that has a value equivalent to the difference between the data value associated with each literal and the lowest value;

determining an index associated with the located entry to be used as part of the code value;

removing the located entry from the possibility table; and sorting remaining entries in the possibility table.

25. A machine-readable medium having instructions stored therein, which when executed by a machine, cause the machine to perform a method for decoding non-repeating data values, the method comprising:

receiving an input stream having a preamble and a payload including a plurality of non-repeating literals encoded therein, each literal being encoded via a unique code value that is different from code values associated with a remainder of the plurality of non-repeating literals;

extracting from the preamble of the input stream a lowest data value among data values that represent the plurality of non-repeating literals, a bit count representing a number of bits required to encode each unique code value, and a literal count representing a number of the plurality of non-repeating literals currently encoded within the input stream;

for each literal up to the literal count, extracting from the payload of the input stream a unique code value associated with each literal, the unique code value representing a predetermined relationship between each literal and a literal associated with the lowest data value; and determining an actual data value representing each literal based on the lowest data value and the unique code value associated with each literal to recover each literal.

26. The machine-readable medium of claim 25, wherein the associated unique code value is extracted from a location determined based on the bit count and a sequential position within the plurality of non-repeating literals, and wherein the actual data value is determined by adding the associated unique code value with the lowest data value.

27. The machine-readable medium of claim 25, wherein the unique code value represents an index of an entry of a possibility table, the entry having a value representing the difference between a data value associated with each literal and the lowest value.

28. The machine-readable medium of claim 27, wherein the method further comprises:

constructing the possibility table having a plurality of entries, each representing a possible difference between a possible literal and a literal associated with the lowest value;

for each literal, locating an entry in the possibility table that has a value equivalent to the difference between the data value associated with each literal and the lowest value;

determining an index associated with the located entry to be used as part of the code value;

removing the located entry from the possibility table; and sorting remaining entries in the possibility table.

* * * * *